US012660133B2

(12) United States Patent
　　Miyashiro

(10) Patent No.: US 12,660,133 B2
(45) Date of Patent: Jun. 16, 2026

(54) ELECTRIC VEHICLE

(71) Applicant: YAMAHA HATSUDOKI KABUSHIKI KAISHA, Iwata (JP)

(72) Inventor: Shidehiko Miyashiro, Shizuoka (JP)

(73) Assignee: YAMAHA HATSUDOKI KABUSHIKI KAISHA, Iwata (JP)

( * ) Notice: Subject to any disclaimer, the term of this patent is extended or adjusted under 35 U.S.C. 154(b) by 164 days.

(21) Appl. No.: 18/338,868

(22) Filed: Jun. 21, 2023

(65) Prior Publication Data

US 2024/0081030 A1 Mar. 7, 2024

(30) Foreign Application Priority Data

Sep. 7, 2022 (JP) ................................. 2022-142293

(51) Int. Cl.
　*H05K 7/20* (2006.01)
　*B62J 45/20* (2020.01)
　*H05K 5/00* (2006.01)
(52) U.S. Cl.
　CPC .......... *H05K 7/20854* (2013.01); *B62J 45/20* (2020.02); *H05K 5/0026* (2013.01)
(58) Field of Classification Search
　CPC ...... H05K 7/20854; H05K 7/209; G06F 1/20; B62D 5/0406; B60K 1/02; B60K 7/00; B60L 50/50; H02K 11/33; H02K 11/38
　See application file for complete search history.

(56) References Cited

U.S. PATENT DOCUMENTS

| | | | |
|---|---|---|---|
| 2007/0000231 A1* | 1/2007 | Otsuka ................... | B60H 1/248 |
| | | | 60/203.1 |
| 2011/0228498 A1* | 9/2011 | Kawai ................ | H05K 7/20854 |
| | | | 361/752 |
| 2012/0160579 A1* | 6/2012 | Taniguchi ............ | B62K 25/283 |
| | | | 180/65.1 |
| 2013/0270024 A1* | 10/2013 | Matsuda ................. | B60L 50/66 |
| | | | 180/220 |

(Continued)

FOREIGN PATENT DOCUMENTS

| | | |
|---|---|---|
| EP | 1508915 A2 | 2/2005 |
| JP | 2005-129820 A | 5/2005 |

(Continued)

OTHER PUBLICATIONS

European Office Action dated Dec. 4, 2024, in the counterpart European Patent Application No. 23174788.2.

(Continued)

*Primary Examiner* — Jayprakash N Gandhi
(74) *Attorney, Agent, or Firm* — Rabin & Berdo, P.C

(57) ABSTRACT

An electric vehicle, including a vehicle body, a controlled device mounted to the vehicle body, and a control device configured to electrically control the controlled device. The control device includes a case member that is mounted to the vehicle body and that has an internal space formed therein, a control board mounted to the case member in the internal space, an electronic component mounted to the control board in the internal space, and a supporting structure provided on an inner surface of the case member and configured to support the electronic component, such that the electronic component is partially exposed in the internal space.

8 Claims, 4 Drawing Sheets

(56)  References Cited

U.S. PATENT DOCUMENTS

| 2014/0367183 A1* | 12/2014 | Matsuda | ............ H01M 50/204 |
| | | | 180/220 |
| 2017/0295662 A1 | 10/2017 | Sakai | |
| 2018/0228047 A1 | 8/2018 | Ota et al. | |
| 2021/0175145 A1 | 6/2021 | Teranishi et al. | |
| 2021/0296202 A1* | 9/2021 | Bender | ................. H05K 1/021 |

FOREIGN PATENT DOCUMENTS

| JP | 2011198985 A | 10/2011 |
| JP | 2012227472 A | 11/2012 |

OTHER PUBLICATIONS

Office Action issued for corresponding EP patent application No. 23174788.2-1201 dated Nov. 13, 2025.

European Office Action dated May 30, 2025, in the counterpart European Patent Application No. 23174788.2.

* cited by examiner

ELECTRIC VEHICLE

CROSS-REFERENCE TO RELATED APPLICATIONS

This application is based on, and claims priority from, Japanese Patent Application No. 2022-142293, filed on Sep. 7, 2022. The contents of the application is incorporated herein by reference.

TECHNICAL FIELD

The present invention relates to an electric vehicle.

BACKGROUND

In recent years, a control unit, for example, an electronic circuit device has been used on an electric vehicle. For example, a patent document (JP2005-129820A) discloses the electronic circuit device. The electronic circuit device includes a case member, a control board and an electronic component. The case member includes an upper case and a lower case. An internal space is formed between the upper case and the lower case. The control board is mounted to the lower case in the internal space. The electronic component are mounted to the control board. Resin is filled in the internal space between the upper case and the electronic component and in the internal space between the upper case and the control board.

SUMMARY OF THE INVENTION

Technical Problems

In a conventional control unit, there is a problem that it is difficult to dissipate heat which is generated by the electronic component, because the resin is filled in the internal space between the upper case and the electronic component and in the internal space between the upper case and the control board.

An object of the present invention is to provide an electric vehicle which can suitably dissipate heat which is generated by an electronic component.

Solution to Problems

An electric vehicle according to one aspect of the present invention includes a vehicle body, a controlled device and a control device. The controlled device is mounted to the vehicle body. The controlled device is electrically controlled. The control device is configured to control the controlled device. The control device includes a case member, a control board, an electronic component and a supporting structure.

The case member is mounted to the vehicle body. The case member forms an internal space. The control board is mounted to the case member in the internal space. The electronic component is mounted to the control board in the internal space. The supporting structure is provided on an inner surface of the case member. The supporting structure is configured to support the electronic component so that the electronic component is partially exposed in the internal space.

With the electric vehicle according to this aspect, the supporting structure of the control device supports the electronic component so that the electronic component is partially exposed in the internal space. Thereby, the electric vehicle can suitably dissipate heat of the electronic component.

The case member can include a first wall portion and a second wall portion. In this case, the first wall portion has the inner surface which is disposed so as to face the control board. The second wall portion protrudes from the first wall portion toward the control board. The second wall portion configures the supporting structure.

With this configuration, the electronic component can be suitably positioned without using a filler such as resin.

The second wall portion can be formed on the first wall portion so as to surround a side surface of the electronic component. Thereby, the electronic component can be more suitably positioned.

The side surface of the electronic component can be fixed to the second wall portion by an adhesive. Thereby, the electronic component can be more suitably positioned.

The electric vehicle can further include a heat dissipation sheet disposed between the case member and the electronic component. Thereby, the electric vehicle can more suitably dissipate the heat of the electronic component.

The case member can include a first case and a second case. In this case, the control board is mounted to the first case. The second case is mounted to the first case. The second case is configured to cover the control board and the electronic component. The supporting structure is provided on the second case.

With this configuration, the control board and the electronic component are mounted to the first case. In this state, the second case is mounted to the first case, so that the control board and the electronic component are easily disposed in the internal space between the first case and the second case in a state that the electronic component is supported by the supporting structure of the second case.

The case member can include a first case and a second case. In this case, the control board is mounted to the first case. The second case is mounted to the first case. The second case is configured to cover the control board. The electronic component is disposed between the control board and the first case. The supporting structure is provided on the first case.

With this configuration, the electronic component is disposed between the control board and the first case in a state where the supporting structure of the first case supports the electronic component. In the state, the second case is mounted to the first case, so that the control board and the electronic component can be easily disposed in the internal space between the first case and the second case in a state that the electronic component is supported by the supporting structure of the second case.

Advantage of Invention

According to this invention, an electric vehicle can suitably dissipate heat which is generated by an electronic component.

DETAILED DESCRIPTION OF PREFERRED EMBODIMENTS

Figure 1:
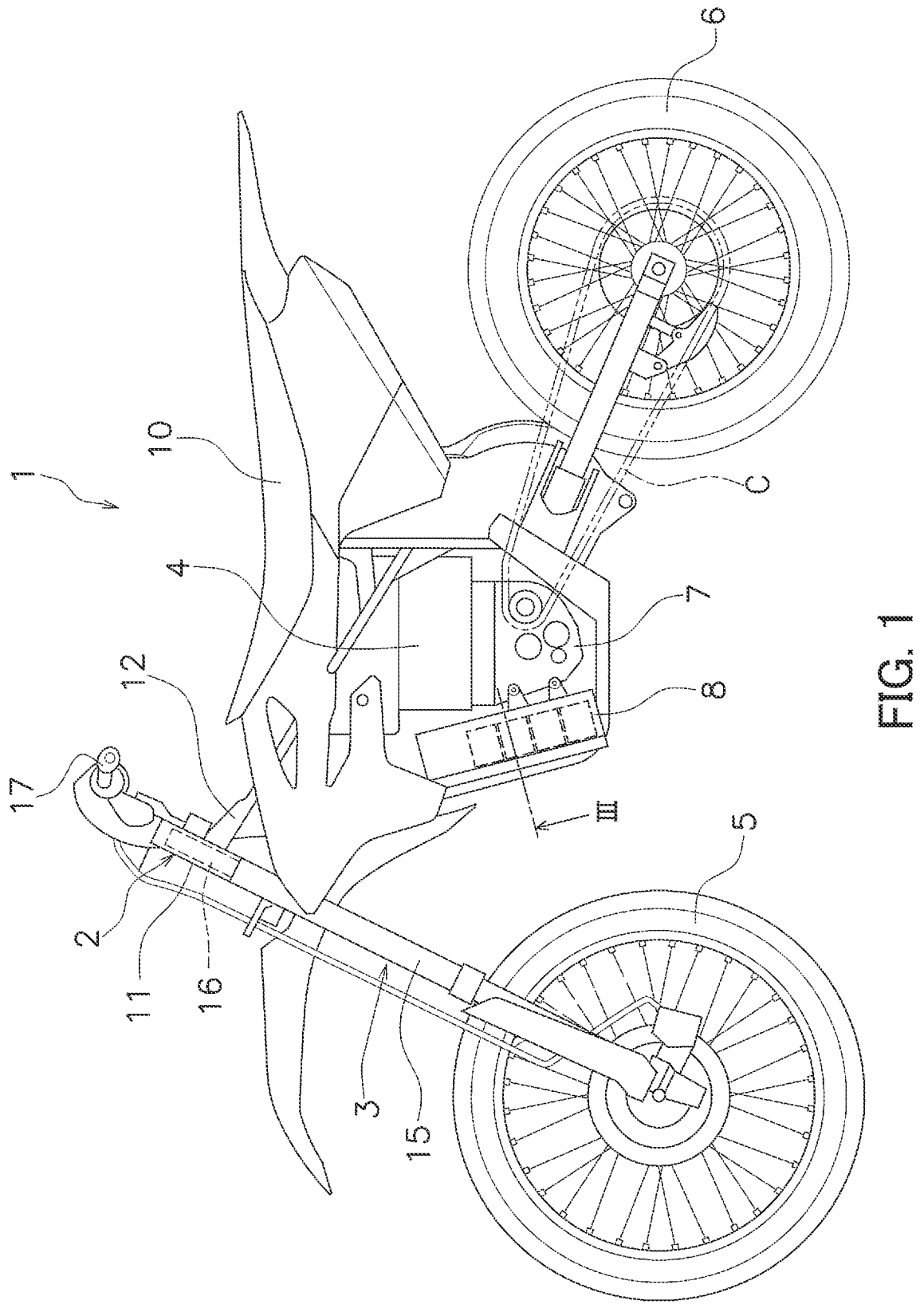
FIG. 1 is a side view of a vehicle body of an electric vehicle.

An electric vehicle according to an embodiment will be described below with reference to the drawings. In this embodiment, as shown in FIG. 1, an example, in which the electric vehicle is a straddled vehicle 1, is shown. A vehicle, which is different from the straddled vehicle 1, can be used as long as the vehicle is an electric vehicle.

A straddled vehicle 1 includes a vehicle body frame 2 (an example of a vehicle body), a steering device 3, a front wheel 5, and a rear wheel 6. The straddled vehicle 1 further includes an electric motor 7 (an example of a controlled device), a control device 8, and a heat dissipation sheet 9 (see FIG. 3).

Figure 2:
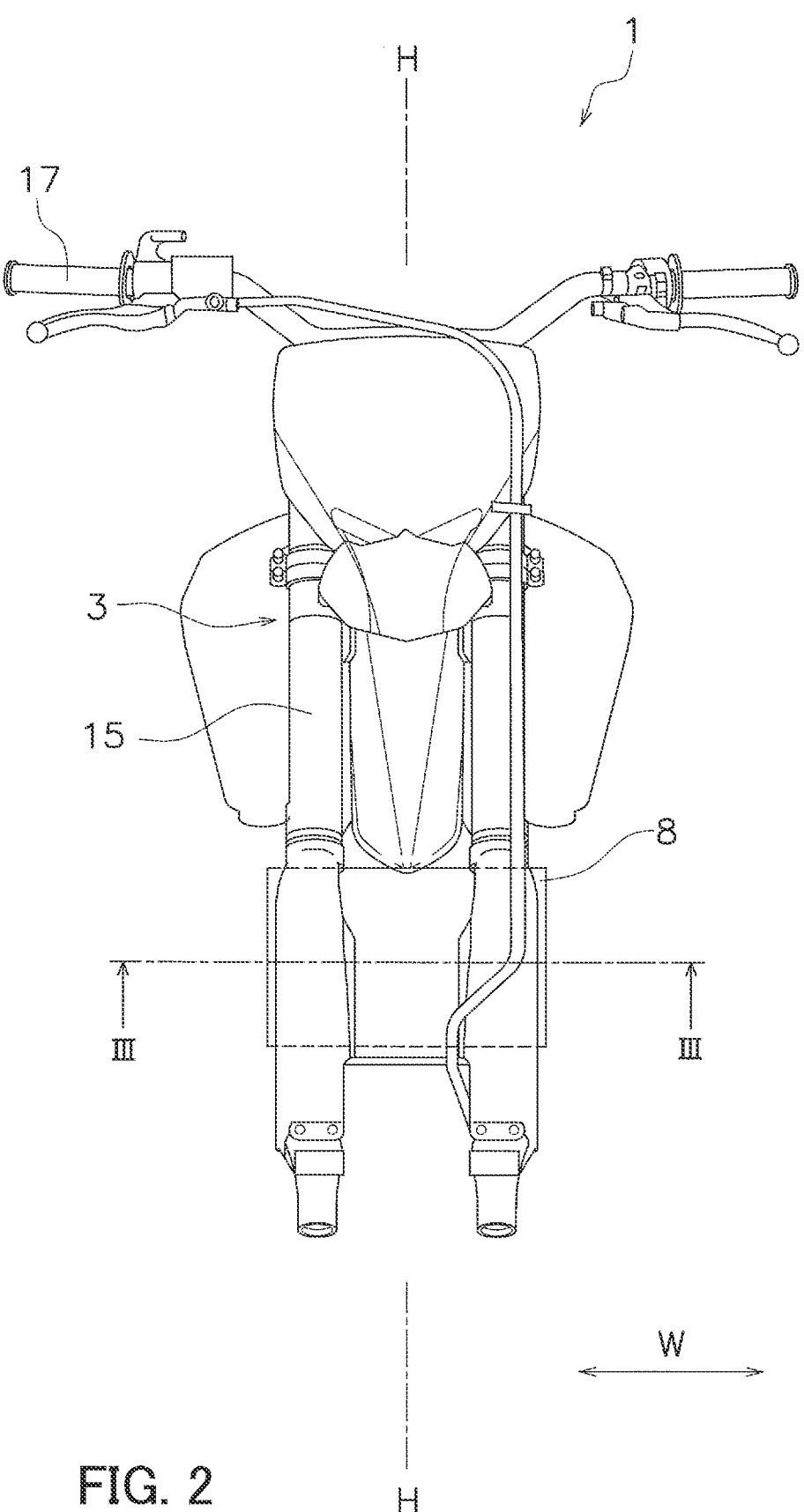
FIG. 2 is a front view of the vehicle body of the electric vehicle in a state where a front wheel removed from the electric vehicle.

As shown in FIG. 2, the straddled vehicle 1 includes a vehicle center plane H extending in a front-rear direction. In this embodiment, a front side of a rider (a left side in FIG. 1), a rear side of the rider (a right side in FIG. 1), a left side of the rider (a right side in FIG. 2), and a right side of the rider (a left side in FIG. 2) respectively correspond to front, rear, left and right directions of the straddled vehicle 1, in a state where the rider is seated on a seat 10. A vehicle width direction W is defined as a direction perpendicular to the vehicle center plane H. For example, the vehicle width direction W indicates the left-right direction with respect to the vehicle center plane H.

An upper side of the rider (an upper side in FIGS. 1 and 2) corresponds to an upper direction of the straddled vehicle 1. A lower direction of the straddled vehicle 1 (a lower direction in FIGS. 1 and 2) is a direction opposite to the upper direction of the straddled vehicle 1. A side view of the straddled vehicle 1 shows a side view of the straddled vehicle 1 viewed from the left side or the right side. For example, FIG. 1 shows the side view of the straddled vehicle 1 viewed from the left side. FIG. 2 shows the front view of the straddled vehicle 1 viewed from the front side.

As shown in FIGS. 1 and 2, the vehicle body frame 2 includes a head pipe 11 and a main frame 12. The main frame 12 is connected to the head pipe 11. The vehicle body frame 2 includes the vehicle center plane H (see FIG. 2) that passes through the head pipe 11 in the front-rear direction.

As shown in FIGS. 1 and 2, the steering device 3 includes a front fork 15, a steering shaft 16 and a handle member 17. The front fork 15 is rotatably supported with respect to the head pipe 11. The steering shaft 16 is connected to the front fork 15. The handle member 17 is connected to the steering shaft 16.

As shown in FIG. 1, the front wheel 5 is rotatably supported by front fork 15. The rear wheel 6 is rotatably supported by the vehicle body frame 2, for example, the main frame 12. The rear wheel 6 are rotated by driving force of the electric motor 7.

As shown in FIGS. 1 and 2, the electric motor 7 is provided on the vehicle body frame 2. For example, the electric motor 7 is mounted to a lower portion of the main frame 12. The electric motor 7 is driven by a battery 4 shown in FIG. 1. The driving force of the electric motor 7 is transmitted to the rear wheel 6. For example, the electric motor 7 drives the rear wheel 6 via the chain C.

Figure 3:
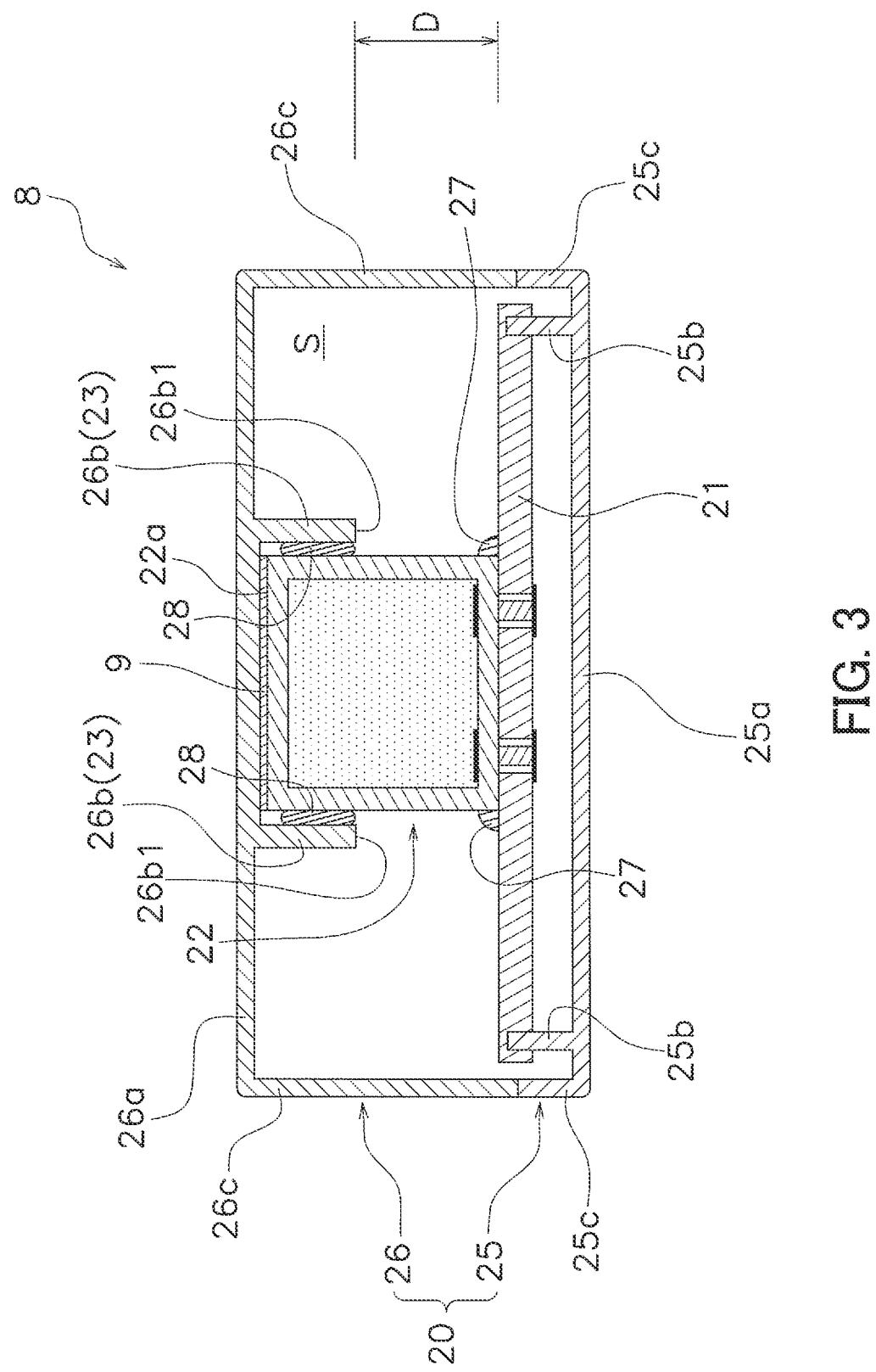
FIG. 3 is a cross-sectional view schematically showing a cross section of the control device which is cut along cutting line III in FIGS. 1 and 2.

The control device 8 is electrically connected to the electric motor 7 and controls the electric motor 7. As shown in FIG. 1, the control device 8 is mounted to the vehicle body frame 2. As shown in FIG. 3, the control device 8 includes a case member 20, a control board 21, electronic component 22, and a supporting structure 23.

The case member 20 is mounted to the vehicle body frame 2. For example, as shown in FIG. 1, the case member 20 is mounted to the main frame 12 on the rear side than the front fork 15. As shown in FIG. 2, the case member 20 is disposed in the vehicle width direction W on the rear side than the front fork 15.

As shown in FIG. 3, the case member 20 forms an internal space S. The internal space S is used as a heat dissipation space for the electronic component 22 and a filler such as resin isn't disposed in the internal space S.

As shown in FIG. 3, the case member 20 includes a first case 25 and a second case 26. The control board 21 is mounted to the first case 25. The first case 25 includes a first bottom wall 25a, a first supporting wall 25b, and a first side wall 25c. The first bottom wall 25a is disposed so as to face the second case 26, for example, a second bottom wall 26a of the second case 26. The second bottom wall 26a will be described later. An inner surface of the first bottom wall 25a forms the internal space S of the case member 20.

The first supporting wall 25b supports the control board 21. The first supporting wall 25b is integrally formed with the first bottom wall 25a. The first supporting wall 25b can be formed in any way as long as the first supporting wall 25b can support the control board 21.

For example, the first supporting wall 25b protrudes from the inner surface of the first bottom wall 25a. Specifically, the first supporting wall 25b protrudes from the inner surface of the first bottom wall 25a toward the second case 26, for example, the second bottom wall 26a of the second case 26.

The first side wall 25c is integrally formed with the first bottom wall 25a so as to surround an outer edge of the first bottom wall 25a. The first side wall 25c extends toward the second case 26, for example, the second side wall 26c of the second case 26. An inner surface of the first side wall 25c forms the internal space S of the case member 20.

As shown in FIG. 3, the second case 26 covers the control board 21 and the electronic component 22. The first case 25 is mounted to the second case 26. For example, the second case 26 includes a second bottom wall 26a (an example of a first wall portion), a second supporting wall 26b (an example of a second wall portion), and a second side wall 26c.

The second bottom wall 26a is disposed so as to face the first case 25, for example, the first bottom wall 25a of the first case 25. For example, the second bottom wall 26a is disposed so as to face the control board 21. An inner surface of the second bottom wall 26a forms the internal space S of the case member 20.

The second supporting wall 26b is formed on the second bottom wall 26a. For example, the second supporting wall 26b protrudes from the inner surface of the second bottom wall 26a. Specifically, the second supporting wall 26b protrudes from the inner surface of the second bottom wall 26a toward the first case 25, for example, the first bottom wall 25a of the first case 25. More specifically, the second supporting wall 26b protrudes from the inner surface of the second bottom wall 26a toward the control board 21. The second supporting wall 26b configures the supporting structure 23 which will be described later.

The second side wall 26c is integrally formed with the second bottom wall 26a so as to surround an outer edge of the second bottom wall 26*a*. The second side wall 26*c* extends toward the first case 25, for example, the second side wall 26*c* of the first case 25. The inner surface of the second side wall 26*c* forms the internal space S of the case member 20.

The first case 25 and the second case 26 are fixed to each other in a state where a tip of the first side wall 25*c* contacts with a tip of the second side wall 26*c*. For example, the tip of the first side wall 25*c* and the tip of the second side wall 26*c* are preferably fixed to each other by a fixing means such as an adhesive. In this state, the internal space S is formed between the first case 25 and the second case 26. The control board 21 and the electronic component 22 are disposed in the internal space S.

The control board 21 controls the electronic component 22. As shown in FIG. 3, the control board 21 is mounted to the case member 20 in the internal space S of the case member 20. For example, the control board 21 is mounted to the first case 25. Specifically, the control board 21 is mounted to the first supporting wall 25*b*.

As shown in FIG. 3, the electronic component 22 is mounted to the control board 21 in the internal space S of the case member 20. For example, the electronic component 22 is fixed to the control board 21 by a fixing means such as a solder. In this state, a side surface of a base end side of the electronic component 22 and an outer surface of the control board 21 are further fixed by the fixing means such as an adhesive 27.

As shown in FIG. 3, supporting structure 23 supports the electronic component 22. For example, the supporting structure 23 supports the electronic component 22 so that the electronic component 22 is partially exposed in the internal space S of the case member 20. The supporting structure 23 is provided on the inner surface of the case member 20. For example, the supporting structure 23 is provided on the inner surface of the second case 26 member 20. Specifically, the supporting structure 23 is configured by the second supporting wall 26*b* of the second case 26.

The second supporting wall 26*b* supports the electronic component 22. The second supporting wall 26*b* is integrally formed with the second bottom wall 26*a* so as to surround a tip portion of the electronic component 22. For example, the second supporting wall 26*b* is integrally formed with the second bottom wall 26*a* so as to surround a side surface of the tip portion of the electronic component 22.

The side surface of the tip portion of the electronic component 22 is fixed to the second supporting wall 26*b* via a fixing means such as an adhesive 28. In this state, a tip 26*b*1 of the second supporting wall 26*b* is disposed at an interval from the control board 21. The heat of the electronic component 22 is dissipated in the internal space S by a distance D between the tip 26*b*1 of the second supporting wall 26*b* and the control board 21.

As shown in FIG. 3, the heat dissipation sheet 9 is disposed between the case member 20 and the electronic component 22. For example, the heat dissipation sheet 9 is disposed between the second bottom wall 26*a* of the second case 26 and a tip surface 22*a* of the electronic component 22. Specifically, the heat dissipation sheet 9 is disposed between the inner surface of the second bottom wall 26*a* which is provided inside the second supporting wall 26*b* and the tip surface 22*a* of the electronic component 22.

With the straddled vehicle 1 including the above configuration, the control device 8 is assembled as follows. First, the heat dissipation sheet 9 is mounted to the tip surface 22*a* of the electronic component 22. The electronic component 22 is mounted to the control board 21. The side surface of the base end side of the electronic component 22 and the outer surface of the control board 21 are fixed by the adhesive 27. In this state, the control board 21 is mounted to the first case 25.

Next, the adhesive 28 is applied to the inner surface of the second supporting wall 26*b* of the second case 26. The tip portion of the electronic component 22 is disposed in a space which is surrounded by the second bottom wall 26*a* of the second case 26 and the second supporting wall 26*b* of the second case 26. Thereby, the heat dissipation sheet 9 is disposed between the inner surface of the second bottom wall 26*a* and the tip surface 22*a* of the electronic component 22. Finally, the first case 25 is fixed to the second case 26.

The straddled vehicle 1 described above has the following features. The straddled vehicle 1 can suitably dissipate the heat of the electronic component 22, because the electronic component 22 is partially exposed in the internal space S of the case member 20.

With the straddled vehicle 1, the electronic component 22 can be suitably positioned without using the filler such as resin, because the electronic component 22 is supported by the second supporting wall 26*b* of the supporting structure 23.

With the straddled vehicle 1, the electronic component 22 can be more suitably positioned, because the second supporting wall 26*b* of the supporting structure 23 surrounds the side surface of the tip portion of the electronic component 22.

With the straddled vehicle 1, the electronic component 22 can be more suitably positioned, because the side surface of the tip portion of the electronic component 22 is fixed to the second supporting wall 26*b* by the adhesive 28.

With the straddled vehicle 1, the heat of the electronic component 22 can be more suitably dissipated, because the straddled vehicle 1 includes the heat dissipation sheet 9 which is disposed between the case member 20 and the electronic component 22.

With the straddled vehicle 1, the control board 21 and the electronic component 22 can be easily disposed in the internal space S between the first case 25 and the second case 26 by mounting the second case 26 to the first case 25 in a state where the electronic component 22 is supported by the second supporting wall 26*b* of the supporting structure 23.

The Other Embodiments

Figure 4:
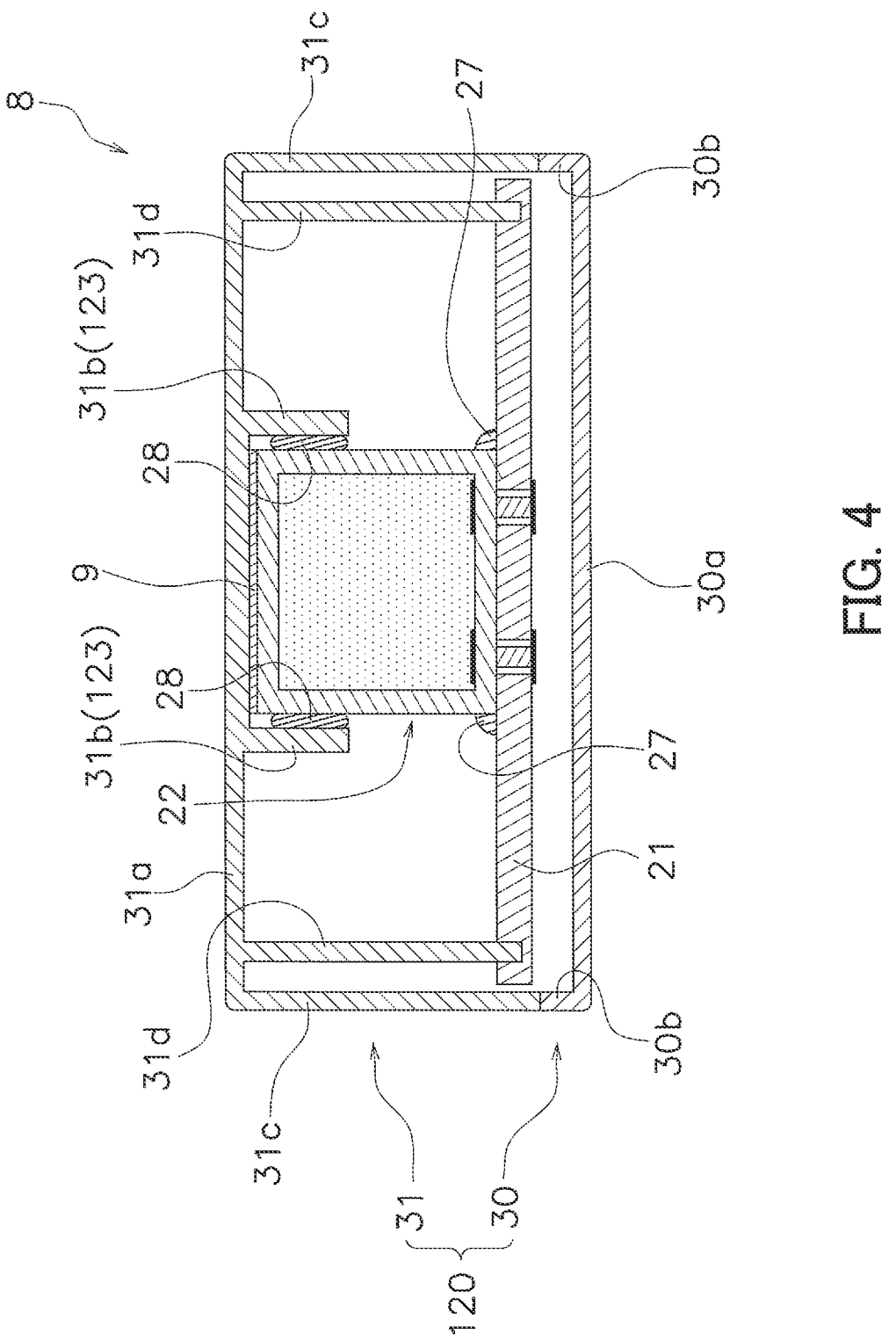
FIG. 4 is a cross-sectional view schematically showing a cross section of the control device which is cut along cutting line III in FIGS. 1 and 2 according to the other embodiment.

The above embodiment can be configured as follows. As shown in FIG. 4, the case member 120 includes a third case 30 (an example of a second case) and a fourth case 31 (an example of a first case). The third case 30 covers the control board 21. For example, the third case 30 covers the control board 21 in a state where the control board 21 is mounted to the fourth case 31.

In the other embodiments, the same reference numerals as the above embodiment is used for the same configurations as the above embodiment. The explanation of the configurations indicated by the same reference numerals is omitted in the other embodiment. The configuration omitted here conforms to the configuration of the above embodiment.

As shown in FIG. 4, the third case 30 includes a third bottom wall 30*a* corresponding to the first bottom wall 25*a* of the first case 25 in the above embodiment and a third side wall 30*b* corresponding to the first side wall 25*c* of the first case 25 in the above embodiment. The third case 30 does not include a supporting wall corresponding to the first supporting wall 25*b* of the first case 25 in the above embodiment.

As shown in FIG. 4, the control board 21 is mounted to the fourth case 31. The fourth case 31 is fixed to the third case 30 in the same way as the above embodiment. For example, the fourth case 31 includes a fourth bottom wall 31a corresponding to the second bottom wall 26a of the second case 26 in the above embodiment, a third supporting wall 31b corresponding to the second supporting wall 26b of the second case 26 in the above embodiment, and a fourth side wall 31c corresponding to the second side wall 26c of the second case 26 in the above embodiment. The fourth case 31 further includes a fourth supporting wall 31d.

As shown in FIG. 4, the third supporting wall 31b configures a supporting structure 123 and supports the tip portion of the electronic component 22. The fourth supporting wall 31d supports the control board 21. The fourth supporting wall 31d is integrally formed with the fourth bottom wall 31a. The fourth supporting wall 31d can be formed in any way as long as the fourth supporting wall 31d can support the control board 21.

For example, the fourth supporting wall 31d protrudes from an inner surface of the fourth bottom wall 31a. Specifically, the fourth supporting wall 31d protrudes from the inner surface of the fourth bottom wall 31a toward the third case 30, for example, the third bottom wall 30a of the third case 30.

With the straddled vehicle 1 including the above configuration, the control device 8 is assembled as follows. First, the heat dissipation sheet 9 is mounted to the tip surface 22a of the electronic component 22. The electronic component 22 are mounted to the control board 21. The side surface of the base end side of the electronic component 22 and the outer surface of the control board 21 are fixed by the adhesive 27.

Next, the adhesive 28 is applied to the inner surface of the third supporting wall 31b of the fourth case 31. In this state, the tip portion of the electronic component 22 is disposed in a space which is surrounded by the fourth bottom wall 31a of the fourth case 31 and the third supporting wall 31b of the fourth case 31. Also, the control board 21 is fixed to the fourth supporting wall 31d. Thereby, the heat dissipation sheet 9 is disposed between the inner surface of the fourth bottom wall 31a and the tip surface 22a of the electronic component 22. Finally, the third case 30 is fixed to the fourth case 31 so as to cover the control board 21.

In this case, the control board 21 and electronic component 22 are mounted to the fourth case 31. By fixing the third case 30 to the fourth case 31 in this state, the control board 21 and the electronic component 22 can be easily disposed in the internal space S between the third case 30 and the fourth case 31. Also, in this case, it is possible to obtain the same effects as the above embodiment.

INDUSTRIAL APPLICABILITY

The present invention can be applied to an electric vehicles.

REFERENCE SIGNS LIST 1 a straddled vehicle
2 a vehicle body frame
7 an electric motor
8 a control device
9 a heat dissipation sheet
20, 120 a case member
21 a control board
22 an electronic component
23,123 supporting structure 25 a first case
26 a second case
26a a second bottom wall
26b a second supporting wall
30 a third case
31 a fourth case
31a a fourth bottom wall
31b a third supporting wall
S an internal space

What is claimed is:

1. An electric vehicle comprising:
a vehicle body;
a controlled device mounted to the vehicle body; and
a control device configured to electrically control the controlled device and including:
   a case member mounted to the vehicle body and having an internal space formed therein,
   a supporting wall protruding from a first inner surface of the case member and formed integrally with the first inner surface,
   a control board mounted to the supporting wall in the internal space,
   an electronic component mounted to the control board in the internal space, and
   a supporting structure provided on a second inner surface of the case member and configured to support the electronic component, such that the electronic component is partially exposed in the internal space, wherein
   the first inner surface and the second inner surface are opposite to each other.

2. The electric vehicle according to claim 1, wherein
the case member includes a first wall portion and a second wall portion,
the first wall portion includes the inner surface, which faces the control board, and
the second wall portion protrudes from the first wall portion toward the control board and configures the supporting structure.

3. The electric vehicle according to claim 2, wherein
the second wall portion is formed on the first wall portion and surrounds a side surface of the electronic component.

4. The electric vehicle according to claim 3, wherein
the side surface of the electronic component is fixed to the second wall portion by an adhesive.

5. The electric vehicle according to claim 2, wherein
a side surface of the electronic component is fixed to the second wall portion by an adhesive.

6. The electric vehicle according to claim 1, further comprising:
a heat dissipation sheet disposed between the case member and the electronic component.

7. The electric vehicle according to claim 1, wherein
the case member includes a first case to which the control board is mounted, and a second case mounted to the first case,
the second case is configured to cover the control board and the electronic component, and
the supporting structure is provided on the second case.

8. The electric vehicle according to claim 1, wherein
the case member includes a first case to which the control board is mounted, and a second case mounted to the first case,
the second case is configured to cover the control board,
the electronic component is disposed between the control board and the first case, and
the supporting structure is provided on the first case.

* * * * *